United States Patent
Yu et al.

(10) Patent No.: US 8,241,531 B2
(45) Date of Patent: Aug. 14, 2012

(54) ZINC OXIDE-BASED CONDUCTOR

(75) Inventors: Tae Hwan Yu, ChungCheongNam-Do (KR); Yoon Gyu Lee, ChungCheongNam-Do (KR); Yil Hwan You, ChungCheongNam-Do (KR); Sang Cheol Jung, ChungCheongNam-Do (KR)

(73) Assignee: Samsung Corning Precision Materials Co., Ltd., Gyeongsangbuk-Do (KR)

( * ) Notice: Subject to any disclaimer, the term of this patent is extended or adjusted under 35 U.S.C. 154(b) by 179 days.

(21) Appl. No.: 12/824,922

(22) Filed: Jun. 28, 2010

(65) Prior Publication Data

US 2011/0001095 A1 Jan. 6, 2011

(30) Foreign Application Priority Data

Jul. 1, 2009 (KR) .................. 10-2009-0059648

(51) Int. Cl.
*H01B 1/08* (2006.01)
*H01L 35/14* (2006.01)
(52) U.S. Cl. .................. 252/519.51; 136/256
(58) Field of Classification Search ............. 252/519.51; 136/252–256
See application file for complete search history.

(56) References Cited

U.S. PATENT DOCUMENTS

2003/0215712 A1* 11/2003 Feddrix et al. .............. 429/224
2008/0315160 A1* 12/2008 Fukatani et al. ............ 252/512

OTHER PUBLICATIONS

Bhalerao et al "Electrical resistivity study of some gallium-manganese spinels", Proc. of the Nuclear Physics and Solid State Physics Symposium 21C 256-7, 1978.*
Shen et al "Grain growth in (Ga,Mn)-codoped ZnO ceramis", Key Engineering Mateirals Vol. 49 (2012) pp. 250-255. (Abstract).*

* cited by examiner

Primary Examiner — Mark Kopec
(74) Attorney, Agent, or Firm — McDermott Will & Emery LLP

(57) ABSTRACT

A zinc oxide-based conductor includes ZnO co-doped with gallium and manganese. Preferably, the doping concentration of the gallium ranges from 0.01 at % to 10 at % and the doping concentration of the manganese ranges from 0.01 at % to 5 at %. More preferably, the doping concentration of the gallium ranges from 2 at % to 8 at % and the doping concentration of the manganese ranges from 0.1 at % to 2 at %. Still more preferably, the doping concentration of the gallium ranges from 4 at % to 6 at % and the doping concentration of the manganese ranges from 0.2 at % to 1.5 at %. The zinc oxide-based conductor is a transparent conductor that is used as an electrode of a solar cell or a liquid crystal display.

4 Claims, 7 Drawing Sheets

Coordination Number = 4

| | | | | | | | | | | |
|---|---|---|---|---|---|---|---|---|---|---|
| Ag$^{1+}$ 0.100 | Al$^{3+}$ 0.039 | As$^{5+}$ 0.034 | B$^{3+}$ 0.011 | Be$^{2+}$ 0.027 | C$^{4+}$ 0.015 | Cd$^{2+}$ 0.078 | Co$^{2+}$ 0.058 | Cr$^{4+}$ 0.041 | Cu$^{1+}$ 0.060 | Cu$^{2+}$ 0.057 | F$^{1-}$ 0.131 | Fe$^{2+}$ 0.063 |
| Fe$^{3+}$ 0.049 | Ga$^{3+}$ 0.047 | Ge$^{4+}$ 0.039 | Hg$^{2+}$ 0.096 | In$^{3+}$ 0.062 | Li$^{1+}$ 0.059 | Mg$^{2+}$ 0.057 | Mn$^{2+}$ 0.066 | Mn$^{4+}$ 0.039 | Na$^{1+}$ 0.099 | Nb$^{5+}$ 0.048 | Ni$^{2+}$ 0.055 | O$^{2-}$ 0.138 |
| OH$^-$ 0.135 | P$^{5+}$ 0.017 | Pb$^{2+}$ 0.098 | S$^{6+}$ 0.012 | Se$^{6+}$ 0.028 | Sn$^{4+}$ 0.055 | Si$^{4+}$ 0.026 | Ti$^{4+}$ 0.042 | V$^{5+}$ 0.036 | W$^{6+}$ 0.042 | Zn$^{2+}$ 0.060 | | |

FIG. 2

|  | Resistivity(Ωcm) | Carrier Density (cm$^{-3}$) | Mobility (cm/V.sec) |
|---|---|---|---|
| GZO | 2.48E-4 | 1.35E+21 | 21.25 |
| MnO 0.2 mole % | 1.37E-04 | 1.52E+21 | 29.98 |
| MnO 0.6 mole % | 1.58E-04 | 1.41E+21 | 27.93 |

FIG. 4

ZINC OXIDE-BASED CONDUCTOR

CROSS REFERENCE TO RELATED APPLICATION

The present application claims priority to Korean Patent Application Number 10-2009-0059648 filed on Jul. 1, 2009, the entire contents of which is incorporated herein for all purposes by this reference.

BACKGROUND OF THE INVENTION

1. Field of the Invention

The present invention relates to a zinc oxide-based conductor, and more particularly, to a zinc oxide-based conductor in which zinc oxide (ZnO) is co-doped with gallium (Ga) and manganese (Mn) to obtain improved electrical conductivity.

2. Description of Related Art

Recently, as a countermeasure against the shortage of energy resources and environmental pollution, the development of high-efficiency solar cells is underway on a large scale. Solar cells are used in various applications such as a power supply for electrical and electronic products, houses, and buildings and an industrial power generator. Technologies, on the basis of which solar cell devices are designed, are considered to have reached a theoretical limit and thus face obstacles to further development. Accordingly, improvement in the efficiency of solar cells by improving the performance of Transparent Conductive Oxides (TCOs), which form the electrodes of solar cells, is gaining more attention.

Indium oxide ($In_2O_3$), which contains a small amount of tin as an impurity, is widely used as a TCO. An indium oxide film that contains a small amount of tin as an impurity, i.e., an $In_2O_3$—$SnO_2$ based film is also known as Indium Tin Oxide (ITO) film. This film is widely used since it is easy to obtain a low-resistance film. The ITO film satisfactorily realizes high transparency of 80% or more and excellent electrical conductivity of $10^{-4}$ Ωcm, required for high-efficiency solar cells.

Extensive research determined that ITO has many merits as a TCO. However, the supply of ITO is instable since indium oxide is a rare metal, obtained as an impurity in the process of refining zinc oxide, and is very expensive. In addition, when a substrate of polymer or the like is used, a TCO should be formed at a low temperature in order to avoid having a harmful thermal effect on a display device or the substrate. However, a film of ITO formed at a low temperature has very low light transparency. In addition, due to weak thermal resistance, the efficiency of a solar cell sharply drops at temperatures of 400° C. or higher. In addition, in the hydrogen plasma process, the high reducibility of In causes chemical instability. Therefore, the development of high-performance transparent conductors that can replace ITO is urgently required, and is becoming a hot issue in the latest research.

As a part of the development of substitute materials, $SnO_2$ and ZnO are gaining attention as the best candidates for the substitute materials for ITO.

Although $SnO_2$ is being distributed and utilized as a transparent conductive material which can substitute for ITO, it has a low light transparency in a long wavelength range (i.e., 900 nm or longer) and deteriorates in the hydrogen plasma process. In addition, it has limits due to material characteristics such as low electrical conductivity, low transparency of about 70%, and the like.

Zinc oxide (ZnO) is a semiconductor material that has a wide band gap (i.e., about 3.3 eV). It has been already demonstrated that zinc oxide can be made to exhibit excellent transparency (i.e., 80% or more) by doping with aluminum, gallium, or the like. Since zinc oxide is very inexpensive compared to indium oxide, it is being actively studied. It is easy to adjust the electrical and optical properties of zinc oxide using the dopant, since zinc oxide is easy to dope and has a narrow conductivity band. Zinc oxide can be an ideal material in terms of its applicability to transparent conductors, since it is appropriate for coating large area, and is stable in the hydrogen plasma process. In addition, zinc oxide can also advantageously realize a solar cell having a high light-trapping capability by increasing the scattering of incident light, since it is appropriate for controlling surface roughness by texturing.

As examples of dopant added to zinc oxide, gallium (Ga), aluminum (Al), and the like are generally used. In the case of aluminum, the drawback is that an aluminum atom may be bonded with oxygen, and thus easily lose its function as a carrier.

Requirements for the transparent conductor may include excellent electrical conductivity as well as high transparency and light trapping efficiency. In order to obtain high electrical conductivity from Ga-doped zinc oxide, a great amount of dopant has to be added. However, it is impossible to raise its electrical conductivity above a certain value due to its limited solid solubility.

The information disclosed in this Background of the Invention section is only for the enhancement of understanding of the background of the invention and should not be taken as an acknowledgment or any form of suggestion that this information forms the prior art that would already be known to a person skilled in the art.

BRIEF SUMMARY OF THE INVENTION

Various aspects of the present invention serve to increase the solid solubility limit in a zinc oxide-based conductor which is doped with gallium and thereby improve the density of electron, electron mobility, and electrical conductivity.

In an aspect of the present invention, the zinc oxide-based conductor includes gallium and manganese with which ZnO is co-doped. Preferably, the doping concentration of the gallium ranges from 0.01 at % to 10 at % and the doping concentration of the manganese ranges from 0.01 at % to 5 at %. More preferably, the doping concentration of the gallium ranges from 2 at % to 8 at % and the doping concentration of the manganese ranges from 0.1 at % to 2 at %. Still more preferably, the doping concentration of the gallium ranges from 4 at % to 6 at % and the doping concentration of the manganese ranges from 0.2 at % to 1.5 at %. In an exemplary embodiment of the invention, the zinc oxide-based conductor can be a transparent conductor that is used as an electrode of a solar cell or a liquid crystal display.

According to the exemplary embodiments of the present invention as set forth above, it is possible to increase the solid solubility limit of gallium in zinc oxide by alleviating stress through co-doping with manganese as well as gallium. Accordingly, it is also possible to improve the electron density and/or mobility of GZO, thereby improving electrical conductivity.

Furthermore, the exemplary embodiments of the present invention as set forth above can improve stability such as resistance to moisture.

The methods and apparatuses of the present invention have other features and advantages which will be apparent from or are set forth in more detail in the accompanying drawings, which are incorporated herein, and the following Detailed Description of the Invention, which together serve to explain certain principles of the present invention.

BRIEF DESCRIPTION OF THE DRAWINGS

FIG. 2 is a table showing ion radii of ions having a coordination number of 4;

FIG. 4 is a table showing resistivity, electron density, and electron mobility according to composition;

DETAILED DESCRIPTION OF THE INVENTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Figure 1:
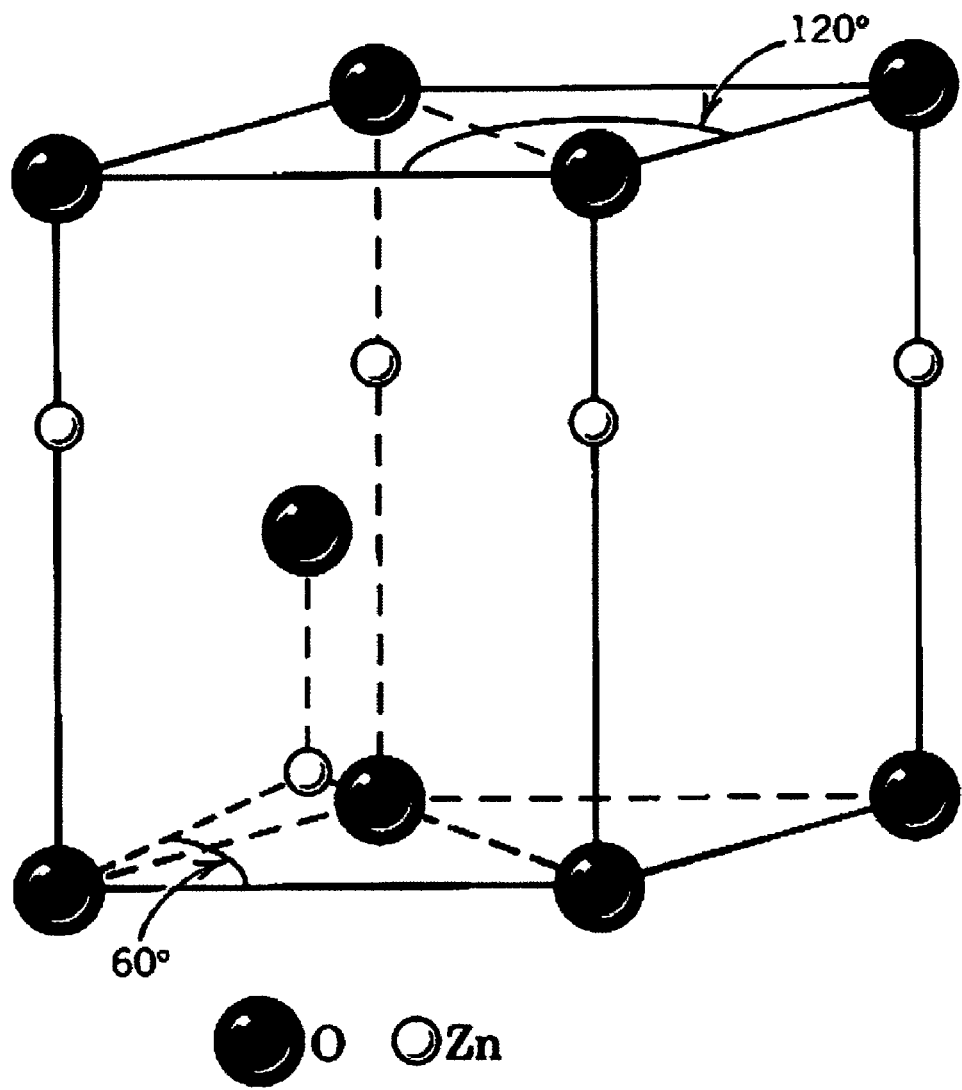
FIG. 1 is a diagram showing a unit cell having a wurtzite structure.

As shown in FIG. 1, zinc oxide (ZnO) is a II-VI group compound semiconductor having a wurtzite crystal structure.

Zinc ions are located at tetrahedral sites defined by oxygen ions, and four anions are placed around each zinc ion. $Ga^{3+}$ is substituted to a $Zn^{2+}$ site and thereby free electron is created. Electron density tends to increase but mobility tends to decrease depending on the doping level of gallium (Ga).

Gallium added as dopant to ZnO becomes a donor in GZO, which increases the density of electrons, thereby increasing electrical conductivity. Here, one of the main factors that determine the solid solubility limit of dopant added to oxide is a difference in the ion radii between host ion and dopant ion. That is, a greater difference in the ion radii between the two ions causes more stress when the dopant is dissolved into the host ion site. Due to this thermodynamic instability, Gallium encounters a solid solubility limit shortly and, as a result, a secondary phase is formed.

FIG. 2 is a table showing ion radii of ions having a coordination number of 4.

The ion radii of ions having a coordinate number 4 are expected to be 0.06 nm. When gallium is ionized to be surrounded by four anions, the ion radius is expected to be 0.047 nm. When a gallium ion enters a zinc site, the gallium ion, which substitutes for a host ion, is smaller by about 20% than the host ion. This results in a decrease in the lattice constant. As the gallium substitutes for zinc, the stress due to the size difference between the two ions causes the Gallium to encounter a solid solubility limit shortly, which has an effect on the electron density and mobility.

Manganese ions exist in the form of divalent and tetravalent ions. When a divalent manganese ion has a coordination number of 4, its ion radius is 0.066 nm and thus about 10% greater than that of a zinc ion. Here, it is possible to alleviate the stress due to doping with gallium to a certain degree since the ion radius of manganese is greater than that of zinc. That is, since doping with manganese can alleviate the stress due to contraction caused by doping with gallium, it is possible to increase the solid solubility limit of gallium in ZnO, and thereby improve the electron density and mobility, as well as the electrical conductivity, of GZO.

Figure 3:
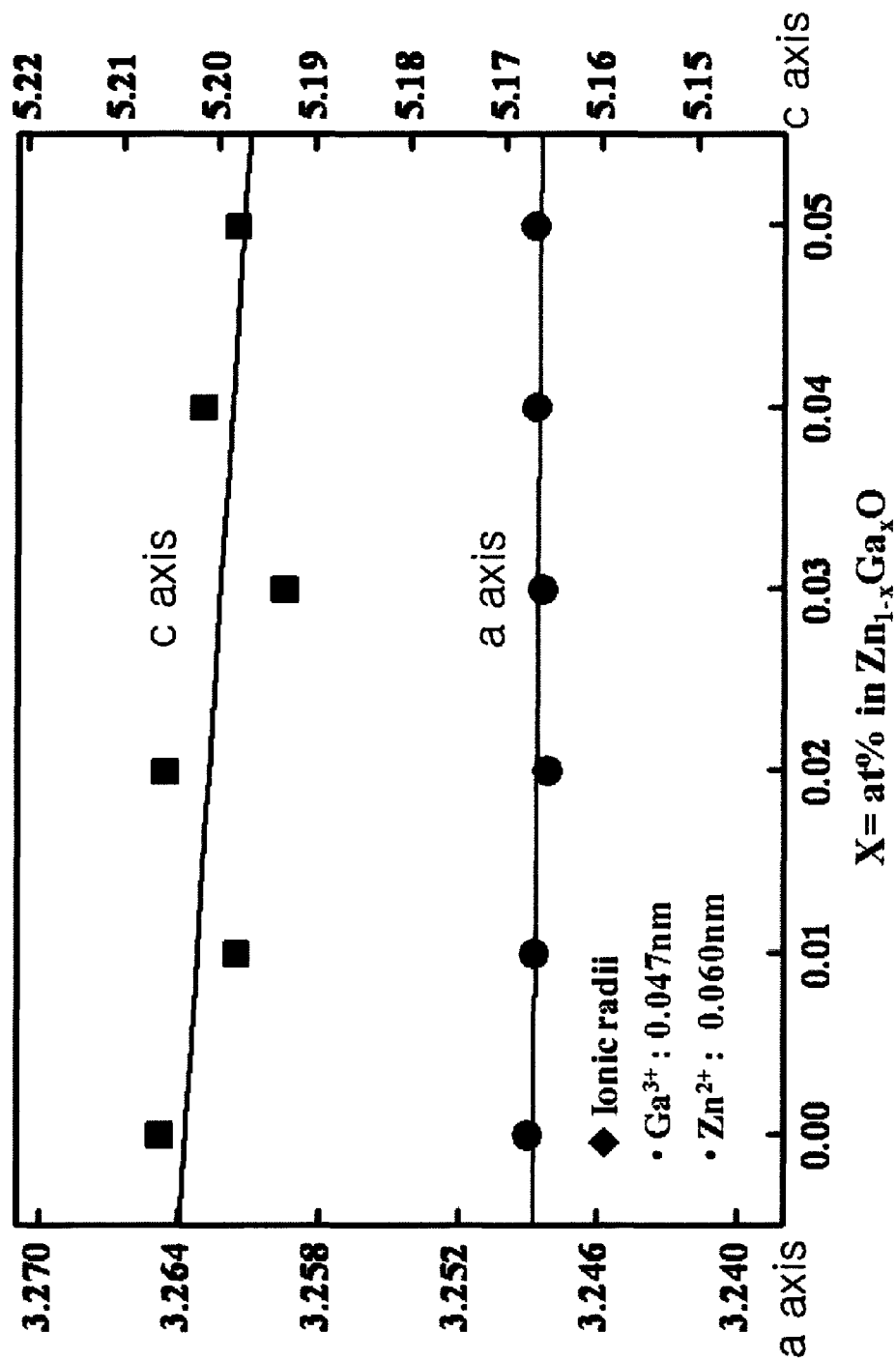
FIG. 3 is a graph showing a decrease in a lattice constant when ZnO is doped with Ga.

FIG. 3 is a graph showing a decrease in lattice constant when ZnO is doped with Ga.

The graph of FIG. 3 shows lattice constants of GZO samples sintered at a temperature of 1,300° C. for 2 hours in air. The left vertical axis indicates lattice constants along the "a" axis, and the right vertical axis indicates lattice constants along the "c" axis. As shown in the figure, it is understood that the lattice constant along the "c" axis decreases as the doping concentration of gallium increases. This results from the difference in the ion radii between the zinc ion and the gallium ion, as described above.

Therefore, in the present invention, manganese is added as a second additive to GZO to increase the solid solubility limit of the gallium ion, thereby improving its electrical conductivity and stability, such as resistance to moisture. Because its conductivity and resistance to moisture are better than those of conventional GZO, this inventive conductor can be used as a sputtering target for a transparent conductor that is used in Liquid Crystal Displays (LCDs) and solar cells.

FIG. 4 is a table showing resistivity, electron density, and electron mobility according to composition.

A thin film was deposited on a substrate by sputtering a zinc oxide-based target under conditions of a substrate temperature of 250° C., and resistivity, carrier density, and mobility of the deposited thin-film zinc oxide conductor were measured.

Compared to conventional GZO, i.e., a zinc oxide conductor produced by doping zinc oxide only with gallium, it can be appreciated that the zinc oxide-based conductor of the invention, i.e., a conductor produced by co-doping zinc oxide with both gallium and manganese, realizes a considerable reduction in resistivity and a great increase in carrier density and mobility. Therefore, this conductor has characteristics suitable for electrodes, such as TCO for a solar cell, or other conductors.

Preferably, the zinc oxide-based conductor has excellent characteristics if the doping concentration of the gallium ranges from 0.01 at % to 10 at % and the doping concentration of the manganese ranges from 0.01 to 5 at %. More preferably, the doping concentration of the gallium ranges from 2 at % to 8 at % and the doping concentration of the manganese ranges from 0.1 to 2 at %. Still more preferably, the doping concentration of the gallium ranges from 4 at % to 6 at % and the doping concentration of the manganese ranges from 0.2 to 1.5 at %.

Figure 5:
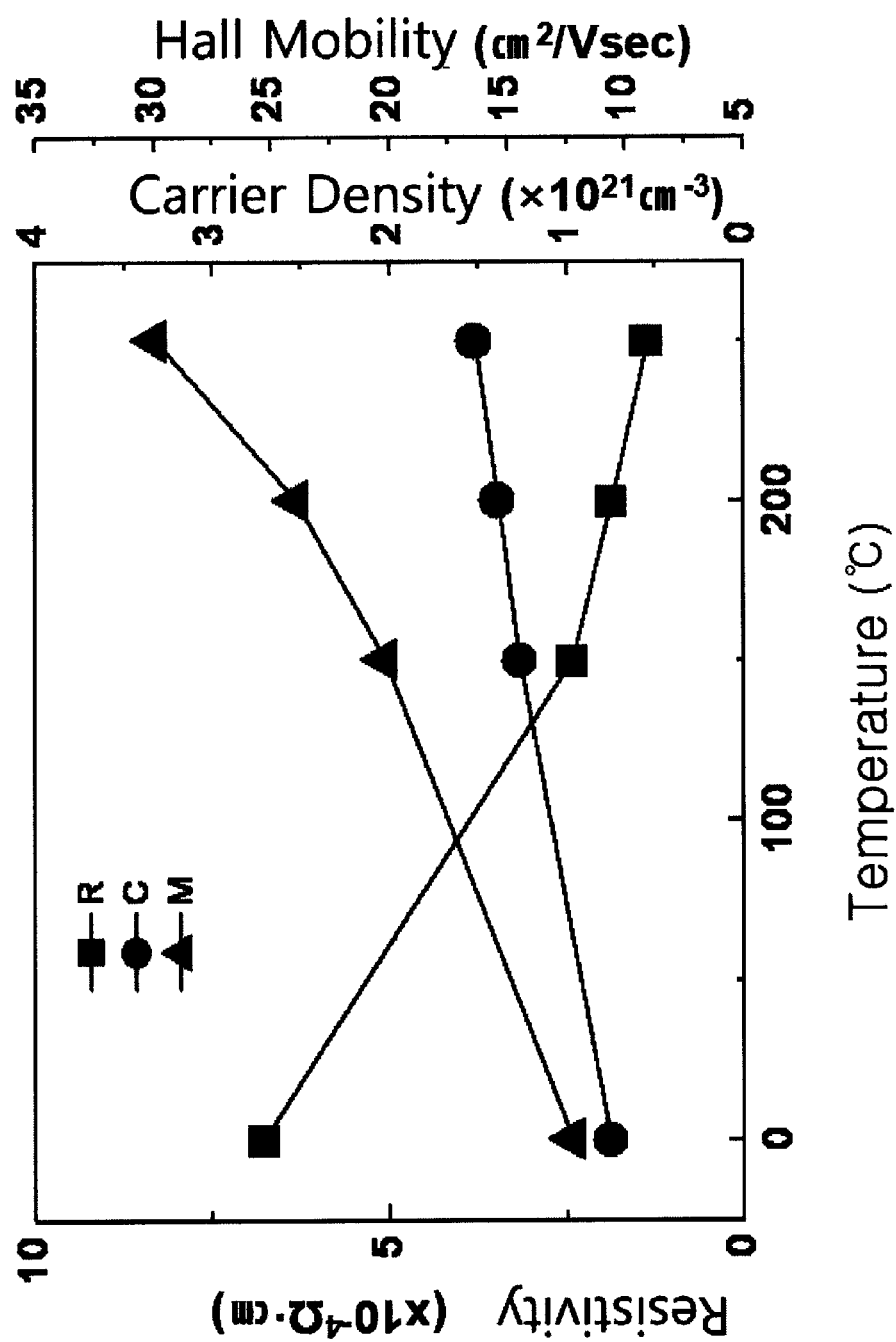
FIGS. 5 and 6 are graphs showing resistivity, Electron density, and hall mobility, according to temperature, of zinc oxide-based conductors obtained by using targets to which MnO is added in amounts of 0.2 mol % and 0.6 mol %, respectively.
Figure 6:
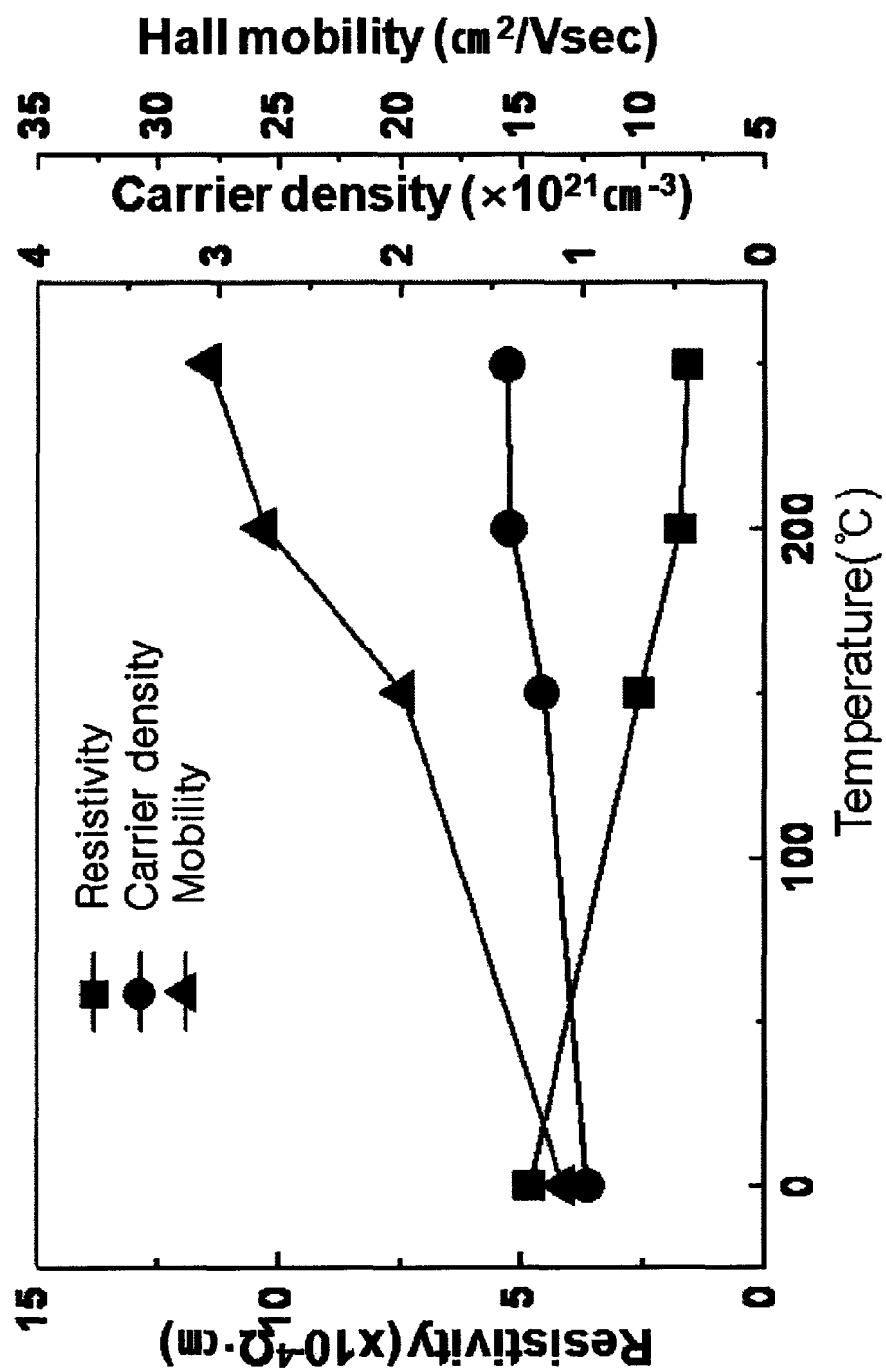

FIGS. 5 and 6 are graphs showing resistivity, Electron density, and hall mobility, according to temperature, of zinc oxide-based conductors obtained by using targets to which MnO is added in amounts of 0.2 mol % and 0.6 mol %, respectively.

The targets to which manganese oxide (MnO) was added in amounts of 0.2 mol % and 0.6 mol % were subjected to sputtering at DC 80 W under a process pressure of 1 Pa and a target-substrate distance of 30 mm. Afterwards, the resistivity, carrier density, and mobility of the film conductor thus produced were measured.

As shown in the figure, it can be appreciated that the film conductor formed under a substrate temperature of 250° C.

had better characteristics as a conductor compared to those formed under substrate temperatures of 0° C., 150° C., and 200° C.

Figure 7:
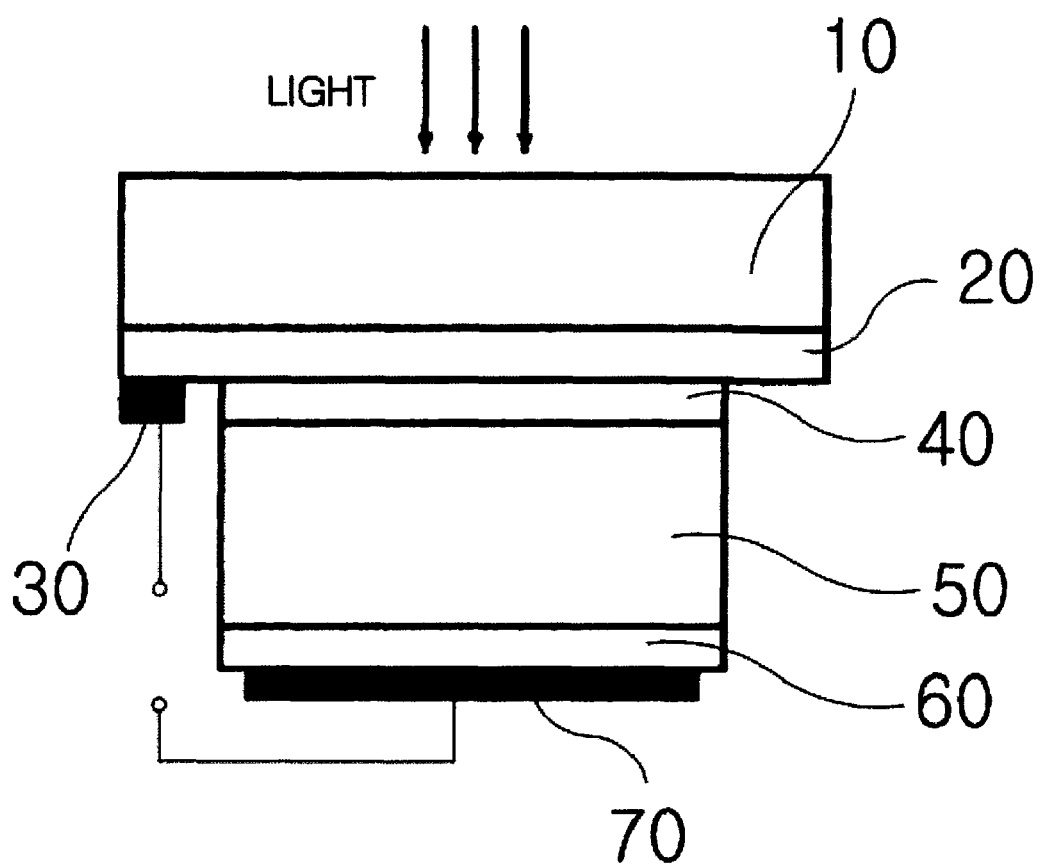
FIG. 7 is a diagram showing an example in which a transparent conductor according to an exemplary embodiment of the invention is used as a TCO for a solar cell.

FIG. 7 is a diagram showing an example in which a transparent conductor according to an exemplary embodiment of the invention is used as a TCO for a solar cell.

Solar cells can be divided generally into a silicon solar cell, a compound solar cell, a dye-sensitized solar cell, and an organic solar cell. In FIG. 7, an amorphous silicon thin-film solar cell, which is one of the kinds of silicon solar cell, is illustrated.

An a-Si:H thin film has a very short carrier diffusion length compared to that of a single-crystal (or poly-crystal) silicon substrate, due to the characteristics of the substance itself. Thus, if the a-Si:H thin film is produced in the form of an np structure, the collection efficiency of electron-hole pairs generated by light is very low. Therefore, as shown in the figure, a pin structure is used, in which an intrinsic a-Si:H light-absorbing layer 50 to which impurity is not added, is interposed between a p-type a-Si:H layer 40 and an n-type a-Si:H layer 60.

In this structure, depletion occurs in the i a-Si:H light-absorbing layer 50 due to the upper and lower p-type and n-type layers 40 and 60 which have high doping concentration, and thus an electric field is formed inside the i a-Si:H light-absorbing layer 50. Therefore, electron-hole pairs created in the i a-Si:H layer by light are collected to the n-type and p-type layers by drift due to the internal electric field, not by diffusion, thereby generating electric current.

Solar light is incident into the i a-Si:H light-absorbing layer through the glass substrate 10, the TCO 20, and the p layer 40. This structure results from a difference in the drift mobility between electrons and holes generated by incident light. In general, since the drift mobility of the holes is lower than that of the electrons, it is required that most carriers be formed in the pi interface to minimize the displacement of the holes, thereby maximizing the collection efficiency of the carriers, which are formed by incident light. For these reasons, solar light is incident to the light-absorbing layer 50 through the p-type layer. Therefore, the p-type a-Si:H layer 40 is also required to have a high optical gap, in addition to high electrical conductivity.

Among the reference numbers that have not been described above, 30 indicates a grid and 70 indicates a rear electrode.

The zinc oxide-based conductor can be used as a transparent conductor not only in electrodes of solar cells but also in electrodes in various other fields, for example, display devices such as LCDs.

The foregoing descriptions of specific exemplary embodiments of the present invention have been presented for the purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A zinc oxide-based conductor comprising gallium and manganese with which ZnO is co-doped,
    wherein the doping concentration of the gallium with respect to the zinc oxide-based conductor ranges from 0.01 at % to 10 at % and the doping concentration of the manganese with respect to the zinc oxide-based conductor ranges from 0.01 at % to 5 at %.

2. The zinc oxide-based conductor according to claim 1, wherein the doping concentration of the gallium with respect to the zinc oxide-based conductor ranges from 2 at % to 8 at % and the doping concentration of the manganese with respect to the zinc oxide-based conductor ranges from 0.1 at % to 2 at %.

3. The zinc oxide-based conductor according to claim 2, wherein the doping concentration of the gallium with respect to the zinc oxide-based conductor ranges from 4 at % to 6 at % and the doping concentration of the manganese with respect to the zinc oxide-based conductor ranges from 0.2 at % to 1.5 at %.

4. The zinc oxide-based conductor according to claim 1, further comprising a transparent conductor for an electrode of a solar cell or a liquid crystal display.

* * * * *